US010695872B2

(12) United States Patent
Zinn et al.

(10) Patent No.: US 10,695,872 B2
(45) Date of Patent: Jun. 30, 2020

(54) HEAT SPREADERS FABRICATED FROM METAL NANOPARTICLES

(71) Applicant: LOCKHEED MARTIN CORPORATION, Bethesda, MD (US)

(72) Inventors: Alfred A. Zinn, Palo Alto, CA (US); Jyotsna Iyer, Saratoga, CA (US); Ike C. Hsu, Los Altos, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 700 days.

(21) Appl. No.: 15/065,760

(22) Filed: Mar. 9, 2016

(65) Prior Publication Data

US 2016/0265858 A1 Sep. 15, 2016

Related U.S. Application Data

(60) Provisional application No. 62/131,784, filed on Mar. 11, 2015.

(51) Int. Cl.
*B23K 31/02* (2006.01)
*H01L 23/373* (2006.01)
(Continued)

(52) U.S. Cl.
CPC ............. *B23K 31/02* (2013.01); *B22F 7/06* (2013.01); *B23K 1/0012* (2013.01); *C22C 26/00* (2013.01);
(Continued)

(58) Field of Classification Search
CPC ......... B23K 31/02; B23K 1/0012; B22F 7/06; C22C 26/00; H01L 23/36; H01L 23/367; H01L 23/3677
(Continued)

(56) References Cited

U.S. PATENT DOCUMENTS 3,678,995 A * 7/1972 Collard .................. H01B 3/004
165/185
5,130,771 A * 7/1992 Burnham ................ C22C 26/00
165/905
(Continued)

FOREIGN PATENT DOCUMENTS

JP 2002-118216 4/2002

OTHER PUBLICATIONS

Extended European Search Report from European Patent Application No. 16762554.0, dated Sep. 26, 2018, 6 pages.

*Primary Examiner* — Tho V Duong
*Assistant Examiner* — Raheena R Malik
(74) *Attorney, Agent, or Firm* — Morgan, Lewis & Bockius LLP (57) ABSTRACT

Heat spreaders can help promote heat distribution at the surface of a heat sink. However, overly isotropic or anisotropic heat conduction through heat spreaders can limit their effectiveness. Heat spreaders providing for lateral distribution of heat can include a tapered structure containing a metal-diamond composite. The metal-diamond composite includes a continuous metallic phase and a plurality of micron-scale diamond particles located in spaced apart regions of the continuous metallic phase. An interlayer containing the continuous metallic phase but lacking micron-scale diamond particles is disposed between each of the spaced apart regions, and the metal-diamond composite increases in lateral size in a direction of increased tapering. Heat spreaders can be formed by disposing a first mixture containing micron-scale diamond particles and metal nanoparticles in first regions that are vertically spaced apart from each other, and at least partially fusing the metal nanoparticles to form a tapered structure.

17 Claims, 5 Drawing Sheets

(51) Int. Cl.
  *H01L 23/367* (2006.01)
  *H01L 23/36* (2006.01)
  *B22F 7/06* (2006.01)
  *C22C 26/00* (2006.01)
  *B23K 1/00* (2006.01)
  *B22F 1/00* (2006.01)
  *C22C 47/02* (2006.01)
  *B23K 101/14* (2006.01)
  *B23K 101/02* (2006.01)
  *B23K 103/00* (2006.01)

(52) U.S. Cl.
  CPC .......... *H01L 23/36* (2013.01); *H01L 23/367* (2013.01); *H01L 23/3677* (2013.01); *H01L 23/3732* (2013.01); *H01L 23/3736* (2013.01); *B22F 1/0018* (2013.01); *B23K 2101/02* (2018.08); *B23K 2101/14* (2018.08); *B23K 2103/50* (2018.08); *C22C 47/025* (2013.01)

(58) Field of Classification Search
  USPC .......................................................... 165/185
  See application file for complete search history.

(56) References Cited

U.S. PATENT DOCUMENTS

| | | | | |
|---|---|---|---|---|
| 5,164,220 A | * | 11/1992 | Caballero | C04B 41/4584 427/577 |
| 5,196,107 A | * | 3/1993 | Nakaoka | C23C 18/1662 205/110 |
| 5,382,314 A | * | 1/1995 | Jin | H01L 21/306 156/60 |
| 5,976,683 A | * | 11/1999 | Liehrr | G02B 5/208 257/77 |
| 6,213,856 B1 | * | 4/2001 | Cho | B24B 53/017 451/443 |
| 6,667,548 B2 | * | 12/2003 | O'Connor | H01L 23/3735 257/625 |
| 6,987,318 B2 | * | 1/2006 | Sung | H01L 23/373 257/720 |
| 7,067,903 B2 | * | 6/2006 | Tachibana | H01L 23/3732 257/625 |
| 7,384,821 B2 | * | 6/2008 | Sung | H01L 23/373 257/E23.111 |
| 7,432,132 B1 | * | 10/2008 | Rotter | H01S 5/4031 257/E23.111 |
| 7,736,414 B1 | | 6/2010 | Zinn | |
| 8,105,414 B2 | | 1/2012 | Zinn | |
| 8,192,866 B2 | | 6/2012 | Golightly et al. | |
| 8,470,701 B2 | * | 6/2013 | Rogers | B81B 7/0093 257/E21.09 |
| 8,486,305 B2 | | 7/2013 | Zinn et al. | |
| 8,679,206 B2 | * | 3/2014 | Wan | B24D 18/0009 51/293 |
| 8,834,747 B2 | | 9/2014 | Zinn | |
| 8,900,704 B1 | | 12/2014 | Zinn | |
| 9,095,898 B2 | | 8/2015 | Zinn | |
| 9,180,572 B2 | * | 11/2015 | Wang | B24B 53/017 |
| 9,724,802 B2 | * | 8/2017 | Sung | B24B 53/017 |
| 2001/0031360 A1 | * | 10/2001 | Rudder | A47J 27/002 428/408 |
| 2005/0019114 A1 | * | 1/2005 | Sung | B21C 3/025 407/119 |
| 2005/0025973 A1 | * | 2/2005 | Slutz | B24B 53/017 428/408 |
| 2005/0276979 A1 | * | 12/2005 | Slutz | B24B 53/017 428/408 |
| 2008/0019098 A1 | * | 1/2008 | Sung | C23C 16/274 361/706 |
| 2010/0052112 A1 | * | 3/2010 | Rogers | B81B 7/0093 257/625 |
| 2010/0155900 A1 | * | 6/2010 | Korenstein | H01L 21/02389 257/615 |
| 2010/0155901 A1 | * | 6/2010 | Korenstein | H01L 21/02389 257/615 |
| 2010/0206537 A1 | * | 8/2010 | Ikeda | H01L 23/3677 165/185 |
| 2010/0216301 A1 | * | 8/2010 | Chen | H01L 29/1602 438/604 |
| 2010/0273402 A1 | * | 10/2010 | Shimizu | B24B 53/017 451/56 |
| 2010/0319898 A1 | * | 12/2010 | Underwood | H01L 23/373 165/185 |
| 2012/0114932 A1 | | 5/2012 | Hu et al. | |
| 2012/0145375 A1 | * | 6/2012 | Beasley | C07C 209/02 165/277 |
| 2013/0120996 A1 | * | 5/2013 | Beasley | F21V 29/004 362/249.02 |
| 2013/0209692 A1 | | 8/2013 | Zinn et al. | |
| 2014/0110722 A1 | * | 4/2014 | Kub | H01L 29/66462 257/77 |
| 2014/0273772 A1 | * | 9/2014 | Chou | B24B 53/017 451/443 |
| 2015/0208496 A1 | * | 7/2015 | Terasaki | B23K 35/30 148/22 |
| 2015/0268704 A1 | * | 9/2015 | Chiriac | F28F 21/00 361/679.54 |
| 2015/0362265 A1 | * | 12/2015 | Broido | H05K 7/20509 361/710 |

\* cited by examiner

FIGURE 9 ered pyrolytic carbon as conductive materials to promote heat conduction. In their present forms, heat spreaders based upon these conductive materials often suffer from shortcomings ranging from insufficient thermal conductivity, purely isotropic thermal properties, overly anisotropic thermal properties, effectiveness only as thin layers, brittleness at low operating temperatures (below about −20° C.), high densities and weights, extended processing times, and/or high processing temperatures (>1000° C.) and pressures (>1 GPa). It can oftentimes be difficult to establish good thermal contact of a heat spreader to a heat source and/or a heat sink, leading to further thermal management difficulties. In addition to inadequate thermal performance, the foregoing factors can lead to application-specific incompatibilities such as, for example, unacceptable mechanical performance and/or poor payload economics due to excessive weight. Further, extreme processing conditions and excessive processing times can represent an undesirable cost burden in some instances.

HEAT SPREADERS FABRICATED FROM METAL NANOPARTICLES

CROSS-REFERENCE TO RELATED APPLICATIONS

This application claims the benefit of priority under 35 U.S.C. § 119 from U.S. Provisional Patent Application 62/131,784, filed on Mar. 11, 2015 and incorporated herein by reference in its entirety.

STATEMENT REGARDING FEDERALLY SPONSORED RESEARCH OR DEVELOPMENT

Not applicable.

FIELD

The present disclosure generally relates to thermal management and, more specifically, to heat spreader technologies and methods related thereto.

BACKGROUND

Ineffective thermal communication between a heat source and a heat sink can hamper the dissipation of excess heat from a system. Heat spreaders represent one approach for thermal management that can be employed in many instances. Heat spreaders can promote more effective thermal communication between a heat source and a heat sink by distributing concentrated heat from a dimensionally small heat source to a considerably larger area at the heat sink. Most typically, a heat spreader abuts both a heat source and a heat sink, thereby providing a continuous bridge through which heat can pass. By spreading the heat over a larger dimensional area at the heat sink, materials having a greater breadth of thermal tolerance can be employed than if the heat remains concentrated in a smaller area. Alternately, a heat spreader can provide a more effective geometry for heat dissipation to take place at the heat sink than would otherwise be possible.

Heat spreaders can be used in a variety of thermal management settings. In some cases, dissipation of excess heat from a system can protect various system components from damage due to overheating. Heat spreaders can often be used for this purpose in the microelectronics industry to protect processing elements and other circuitry from thermal damage. In other cases, dissipation of excess heat from a system can promote more efficient operation of various system components. As a specific example, the performance of communication systems in space vehicles and other environments can be strongly influenced by the thermal state of solid state power amplifiers (SSPAs) housed therein. It can often be difficult to distribute high power densities residing on the power amplifier into large-area radiators for rejection of waste heat into space. Although heat spreaders can facilitate these processes and others, they can often be limited in their effectiveness at doing so, as discussed hereinafter. Moreover, it is considered unlikely that present heat spreader technologies can accommodate the rate of power density increase currently ongoing in electronic devices.

Existing heat spreader technologies often use metals such as copper or aluminum, alloys such as WCu or MoCu, ceramics such as SiC or BN, phase change materials, BeO, diamond, graphite, pitch-based carbon fiber composites, copper graphite composites, and/or thin sheets of highly oriented pyrolytic carbon as conductive materials to promote As indicated above, purely isotropic or overly anisotropic heat conduction can be problematic for heat spreader technologies. Substantially isotropic heat conduction can result in inadequate lateral distribution of heat and generation of excessive "hot spots" at the heat sink, which can be damaging and also result in poor heat transfer, especially when heat is being transferred to a heat pipe system. Overly anisotropic heat conduction can likewise be problematic. Anisotropic through-plane heat conduction can similarly result in generation of "hot spots" and poor lateral distribution of heat. Overly anisotropic in-plane (i.e., lateral) heat conduction, in contrast, can result in poor conveyance of heat to a heat sink.

It can be difficult to achieve a thermal conductivity profile that is sufficiently anisotropic to allow lateral heat conduction to take place while still achieving good through-plane heat transfer. In their present forms, copper and aluminum provide excessively high through-plane heat transfer. CVD diamond similarly provides high thermal conductivity in the through-plane direction and minimal lateral heat distribution. Although graphite can distribute heat laterally, it can exhibit overly anisotropic heat transfer performance and can be difficult to employ on a large scale. Moreover, graphite cannot typically be brazed or soldered to establish a direct bond to a heat source or a heat sink. Metal epoxies and metal-fiber composites can similarly be limited by their low thermal conductivity values and/or high processing temperatures that can degrade mechanical properties.

In view of the foregoing, further improvements in heat spreader technologies and methods for their fabrication would be of significant interest in the art. The present disclosure satisfies these needs and provides related advantages as well.

SUMMARY

In various embodiments, heat spreaders of the present disclosure can include: a tapered structure including a metal-diamond composite. The metal-diamond composite includes a continuous metallic phase and a plurality of micron-scale diamond particles located in spaced apart regions of the continuous metallic phase. An interlayer containing the continuous metallic phase but lacking micron-scale diamond particles is disposed between each of the spaced apart regions. The metal-diamond composite increases in lateral size in a direction of increased tapering.

In other various embodiments, systems of the present disclosure can include: a heat source, a heat sink, and a heat spreader extending between the heat source and the heat sink and bonded thereto. The heat spreader includes a tapered structure including a metal-diamond composite. The metal-diamond composite includes a continuous metallic phase and a plurality of micron-scale diamond particles located in spaced apart regions of the continuous metallic phase. An interlayer containing the continuous metallic phase but lacking micron-scale diamond particles is disposed between each of the spaced apart regions. The metal-diamond composite increases in lateral size from the heat source to the heat sink.

In still other various embodiments, methods of the present disclosure can include: disposing a first mixture containing micron-scale diamond particles and metal nanoparticles in first regions that are vertically spaced apart from each other, disposing a second mixture containing metal nanoparticles but lacking micron-scale diamond particles in second regions located between each of the first regions, and at least partially fusing the metal nanoparticles to form a tapered structure containing a metal-diamond composite. The metal-diamond composite includes a continuous metallic phase within the first regions and the second regions. The first regions increase progressively in lateral size.

The foregoing has outlined rather broadly the features of the present disclosure in order that the detailed description that follows can be better understood. Additional features and advantages of the disclosure will be described hereinafter. These and other advantages and features will become more apparent from the following description.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to heat spreaders that are fabricated from metal nanoparticles. The present disclosure is also directed, in part, to heat distribution systems containing a heat spreader that is fabricated from metal nanoparticles. The present disclosure is also directed, in part, to methods for fabricating heat spreaders from metal nanoparticles and micron-scale diamond particles.

As discussed above, existing heat transfer technologies utilizing heat spreaders can be problematic in a number of instances. Among other issues, existing heat spreader technologies can often display substantially isotropic heat conduction or excessively anisotropic heat conduction. Neither situation is particularly desirable, since a heat spreader ideally promotes both in-plane (i.e., lateral) and through-plane heat conduction, thereby facilitating lateral distribution of heat while still transferring heat through-plane to a heat sink. Unfortunately, features leading to good in-plane thermal transfer often lead to poor through-plane heat conduction, and vice versa, thereby leading to poor lateral distribution of heat at a heat sink. Stated differently, it can be difficult to provide a proper balance of isotropic and anisotropic heat conduction to accomplish the foregoing. Furthermore, heat spreaders containing some types of materials can be difficult to bond to a heat source or a heat sink, such as through soldering or brazing. Many of the materials that are capable of providing effective in-plane heat conduction can be especially limited in this respect.

The present inventors discovered various configurations for heat spreaders that are based upon metal-diamond composites. The metal-diamond composites can be formed from a mixture of diamond particles and metal nanoparticles, which can be consolidated under gentle conditions, such as hot pressing, to at least partially fuse the metal nanoparticles together into a continuous metallic phase of a desired shape. Under gentle consolidation conditions, the metal nanoparticles experience only a minimal increase in grain size, thereby preserving at least a portion of the original nanoparticulate structure. This also allows tailoring of the composite's porosity to be realized. In addition, the continuous metallic phase can allow direct bonding to heat pipes and other heat sinks to be realized, thereby promoting especially effective heat transfer from a heat source.

The diamond particles in the metal-diamond composite can allow high thermal conductivity values to be realized. Copper nanoparticles can be particularly desirable for inclusion in metal-diamond composites due to the reasonably low cost of copper, its relatively good impedance matching with diamond, and its own high thermal conductivity. The impedance matching of diamond to copper likewise promotes good overall thermal conductivity through minimizing phonon scattering within the metal-diamond composite. In addition, the thermal conductivity and impedance matching can be further improved by including a carbide-forming additive in the composites that can form a thin layer (single atom to <10 nm thick layer) of carbide upon the diamond particles, as discussed further hereinafter.

By appropriately choosing the size(s) of the diamond particles and their location(s) within the metal-diamond composite, further enhancements in thermal conductivity and other advantages can be realized. In particular, the inventors discovered that micron-scale diamond particles (i.e., diamond particles having a size ranging between about 1 micron and about 1000 microns) can provide for good dispersibililty in the continuous metallic phase. Micron-scale diamond particles having a size ranging between about 25 microns and about 300 microns can be particularly suitable for use in the embodiments described herein. Micron-scale diamond particles having a size ranging between about 200 microns and about 250 microns can represent a good compromise of providing dispersibility and a small grain boundary for minimizing phonon scattering. Other illustrative size ranges for the micron-scale diamond particles can range between about 50 microns and about 250 microns, or between about 100 microns and about 250 microns, or between about 100 and about 200 microns, or between about 150 microns and about 250 microns. Further, micron-scale diamond particles can be readily dispersed within metal nanoparticle compositions, thereby allowing the resulting mixture to be placed in desired locations for forming a metal-diamond composite.

With just a continuous metallic phase and micron-scale diamond particles, the metal-diamond composites discussed above would have substantially isotropic thermal conductivity properties, thereby leading to poor lateral heat distribution capabilities. The inventors further discovered that thin interlayers can be incorporated within the metal-diamond composites, where the interlayers decrease the extent of through-plane heat transfer that takes place and instead promote lateral heat transfer. More particularly, the interlayers lack the micron-scale diamond particles and are located between regions of the metal-diamond composite that do contain the micron-scale diamond particles. The continuous metallic phase extends between the regions containing the metal-diamond particles and the interlayers. By decreasing the extent of through-plane heat transfer that takes place, the heat can be retained in a portion of the metal-diamond composite containing the micron-scale diamond particles and undergo lateral shunting. By keeping the interlayers sufficiently thin, they can shunt the heat laterally while not compromising the overall through-plane thermal conductivity to an excessive degree. Effectively, the interlayers allow anisotropic thermal conductivity properties to be imparted to the metal-diamond composites.

Lateral shunting of the heat can take place through the interlayers themselves, or within a portion of the metal-diamond composite abutting the interlayers. In some instances, nanodiamond particles, fibers, or any combination thereof can be included in the interlayers in order to promote heat transfer. Due to their small size, nanodiamond particles can scatter phonons at an interface with the interlayers more so than can micron-scale diamond particles, thereby forcing increased lateral heat distribution (e.g., in a layer not containing the nanodiamond particles) instead of through-plane heat transfer. Fibers can both increase the structural integrity of the interlayers and promote lateral heat transfer within the interlayers themselves, provided that the fibers are oriented in-plane within the interlayers to promote directional thermal conductivity. In addition, fibers can also provide some impedance in the through-plane direction to promote lateral heat distribution.

Although interlayers can be continuous across a section of the metal-diamond composites, they can also be discontinuous (see FIG. 6) while still remaining consistent with the embodiments of the present disclosure. Discontinuous interlayers can similarly affect lateral shunting of heat in portions of the metal-diamond composites where micron-scale diamond particles are present. The spacing of discontinuities within a discontinuous interlayer can be adjusted to balance a desired degree of lateral heat transfer against through-plane heat transfer or to realize other advantages. For example, if a continuous interlayer interrupts through-plane heat transfer to an unacceptable degree, a discontinuous interlayer can be utilized instead. In some embodiments, a loose mesh of carbon fibers can provide a discontinuous interlayer that can sufficiently disrupt through-plane thermal conductivity to force lateral heat distribution.

The interlayers described hereinabove can similarly be incorporated within metal-diamond composites using metal nanoparticle compositions. Specifically, one can form an unconsolidated precursor of the metal-diamond composites by sequentially layering a first mixture of metal nanoparticles and micron-scale diamond particles with a second mixture containing metal nanoparticles but no micron-scale diamond particles. Upon consolidating the precursor, an interlayer lacking micron-scale diamond particles can result between two spaced apart regions containing micron-scale diamond particles. Because metal nanoparticles are present throughout the precursor, a continuous metallic phase can be formed upon consolidation in both the regions containing micron-scale diamond particles and those that do not (i.e., the interlayers). Optional materials for inclusion in the interlayers, such as nanodiamond particles and/or fibers, can also be readily incorporated and dispensed with the metal nanoparticle compositions when forming the unconsolidated precursor. Other materials that can be present in the interlayers include, for example, Al, SiC, BN, BeO, AlN and the like in particle, flake or whisker form to moderate impedance in the through-plane direction.

In addition, further additives can be incorporated in the metal nanoparticle compositions used for forming either the portions of the composites containing the micron-scale diamond particles or the interlayers. In some instances, the further additive can be a carbide-forming additive. Suitable examples include those discussed below. Inclusion of a carbide-forming additive in the composites can increase the degree of contact between the continuous metallic phase and the micron-scale diamond particles or the nanodiamond particles, if present, which can improve the thermal conductivity still further. Specifically, the carbide-forming additive can form a surface carbide upon the micron-scale diamond particles or the nanodiamond particles, if present, to promote heat transfer by improving phonon coupling between the diamond and the continuous metallic phase.

As discussed above, metal nanoparticles can be advantageous for practicing the various embodiments of the present disclosure due to their ready consolidation at convenient processing temperatures while still maintaining their original nanoparticulate structure upon undergoing consolidation, at least in part. The resulting continuous metallic phase can also be readily bonded to heat source and heat sinks, as indicated above. Metal nanoparticles also provide a suitable matrix in which other materials such as diamond particles and fibers can be readily incorporated for dispensation into a desired shape. Particularly suitable compositions that can be dispensed and shaped in the various embodiments of the present disclosure are described hereinbelow.

Because metal nanoparticle compositions can be dispensed so readily, they can be introduced into a preform template that allows formation of a consolidated structure with increasing lateral dimension from one face to another. That is, by using appropriately shaped preform templates and suitable placement of micron-size diamond particles, tapered structures containing a metal-diamond composite with interlayers can be obtained upon metal nanoparticle consolidation. Thus, metal nanoparticles can be utilized to form an appropriately shaped heat spreader without employing costly post-fabrication machining operations to define a desired shape. A variety of structural variations are possible in this regard, as discussed further herein.

Before further discussing heat spreaders and related embodiments of the present disclosure, a brief introduction to metal nanoparticles will first be provided. Further details directed to metal nanoparticles and compositions thereof are provided hereinbelow. Metal nanoparticles can exhibit a number of properties that differ significantly from those of the corresponding bulk metal. As used herein, the term "metal nanoparticle" will refer to metal particles that are about 100 nm or less in size, without particular reference to the shape of the metal particles. Although metal nanoparticles can be substantially spherical, they need not necessarily be so.

One property of metal nanoparticles that can be of particular importance is nanoparticle fusion or consolidation that occurs at the metal nanoparticles' fusion temperature. As used herein, the term "fusion temperature" will refer to the temperature at which a metal nanoparticle liquefies, thereby giving the appearance of melting. As used herein, the terms "fusion" or "consolidation" will refer to the coalescence or partial coalescence of liquefied metal nanoparticles with one another to form a larger mass. The consolidation of the metal nanoparticles increases the effective grain size. Depending upon how long the consolidation process takes, the grain size can remain in a nanoparticulate size range or even approach that of bulk metal.

Upon decreasing in size, particularly below about 20 nm in equivalent spherical diameter, the temperature at which metal nanoparticles can be liquefied drops dramatically from that of the corresponding bulk metal. For example, copper nanoparticles having a size of about 20 nm or less can have fusion temperatures of about 220° C. or below, or about 200° C. or below, in comparison to bulk copper's melting point of 1083° C. Thus, the fusion of metal nanoparticles can allow metal working to take place at processing temperatures that are considerably lower than the melting point of the corresponding bulk metal. Accordingly, the low fusion temperature of metal nanoparticles can allow metal-diamond composites to be fabricated at low processing temperatures according to the disclosure herein.

In various embodiments, heat spreaders of the present disclosure can include a tapered structure containing a metal-diamond composite, where the metal-diamond composite contains a continuous metallic phase and a plurality of micron-scale diamond particles located in spaced apart regions of the continuous metallic phase. The metal-diamond composites further include an interlayer containing the continuous metallic phase but lacking micron-scale diamond particles disposed between each of the spaced apart regions where the micron-scale diamond particles are present. The metal-diamond composite increases in lateral size in a direction of increase tapering within the tapered structure.

As indicated above, the metal-diamond composites within the heat spreader can be formed from metal nanoparticles. Both the spaced apart regions of the composite containing the micron-scale diamond particles and the interlayers lacking the micron-scale diamond particles include the continuous metallic phase. Thus, the continuous metallic phase is contiguous throughout the metal-diamond composites of the present disclosure. The micron-scale diamond particles, in contrast, are dispersed discontinuously throughout the composites in the continuous metallic phase, where the micron-scale diamond particles are not present within the interlayers.

Because the metal-diamond composites within the tapered structure are formed from metal nanoparticles, the continuous metallic phase can retain a nanoparticulate morphology in some embodiments of the present disclosure. For example, in some embodiments, the continuous metallic phase can have a grain size of about 250 microns are less. In some embodiments, the porosity of the continuous metallic phase can be about 20% or less at these grain sizes. Significantly larger grain sizes and decreased porosity values can increase the extent of thermal conductivity, particularly in the through-plane direction. Hence, in order to promote in-plane (i.e., lateral) heat distribution, it can be desirable to maintain the grain size in a nanoparticulate size range, particularly in the interlayers. In alternative embodiments of the present disclosure, however, more extensive consolidation to even larger grain sizes, approaching that of bulk metal, and even lower porosity values can be utilized.

In some embodiments, the micron-scale diamond particles within the composites of the present disclosure can have a cubo-octahedral morphology. Cubo-octahedral diamond particles can provide for efficient packing an allow high loadings of micron-scale diamond particles to be realized. Other micron-scale diamond particles can be utilized, such as those having fractured shapes and those having sharp corners, tips and edges. In more particular embodiments, the plurality of micron-scale diamond particles in the metal-diamond composites can range between about 200 microns and about 250 microns in size. As discussed above, micron-scale diamond particles within this size range can be particularly advantageous due to their ready dispersibility in metal nanoparticles and their limited scattering of phonons. The foregoing range can represent an average particle size, and in a normal distribution, some diamond particles with a size residing above or below this range can be present depending on the spread of the size distribution curve. In some embodiments, the micron-scale diamond particles can be further sized (e.g., through sieving or other suitable size selection techniques) to maintain substantially all of the micron-scale diamond particles within this range. It is to be recognized, however, that micron-scale diamond particles residing within other size ranges can also be used in alternative configurations of the present disclosure, as indicated above.

The metal-diamond composites within the heat spreaders of the present disclosure can contain fairly high loadings of micron-scale diamond particles. Good thermal conductivity properties can be realized in doing so. In illustrative embodiments, the metal-diamond composites can include about 10% to about 75% micron-scale diamond particles by volume. In more particular embodiments, the metal-diamond composites can include about 40% to about 70% micron-scale diamond particles by volume, or about 25% to about 70% micron-scale diamond particles by volume, or about 35% to about 70% micron-scale diamond particles by volume, or about 45% to about 60% micron-scale diamond particles by volume.

As discussed above, heat spreaders of the present disclosure can incorporate a tapered structure that is configured for spreading heat both in-plane and through-plane with respect to a heat source and a heat sink. The interlayers within the metal-diamond composites can particularly promote in-plane heat transfer by providing impedance and forcing the heat distribution to occur laterally. As used herein, the term "in-plane" will refer to a direction of heat transfer that is substantially lateral (i.e., parallel) to the surface of the heat source and the heat sink, and the term "through-plane" will refer to a longitudinal direction that extends toward between the heat source and the heat sink. Accordingly, the tapered structures of the heat spreaders can have a surface at a heat source that is of smaller dimensional area than is the surface at the heat sink. Therefore, the heat spreaders of the present disclosure can distribute heat over a broader area at the heat sink. In some embodiments, the surfaces at the heat source and the heat sink can be substantially planar surfaces. However, any surface geometry can be formed by utilizing a suitable preform when fabricating a heat spreader of the present disclosure.

Figure 1:
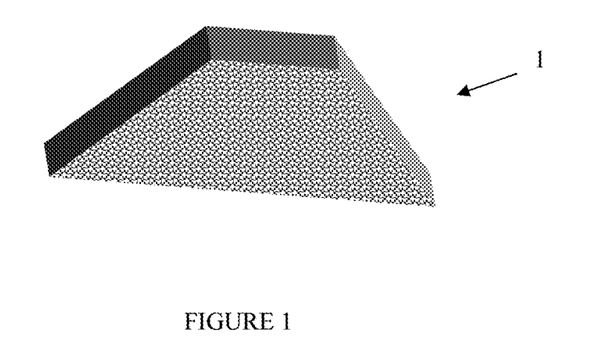
FIGS. 1 and 2 show perspective views of illustrative prismatic and truncated cone heat spreaders, respectively.
Figure 2:
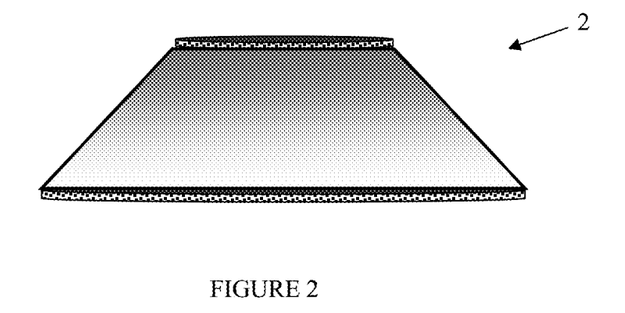
Figure 3:
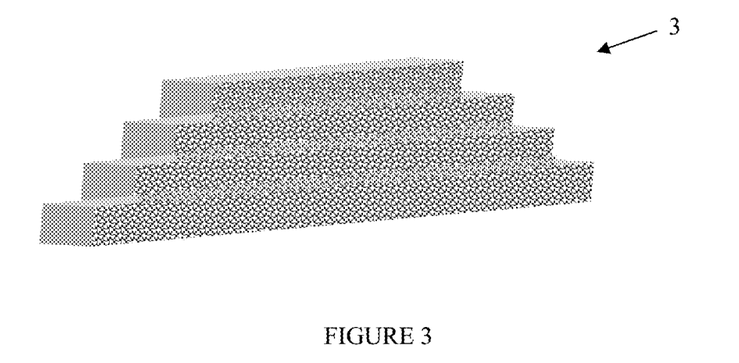
FIG. 3 shows a perspective view of an illustrative stepped-tier heat spreader.
Figure 4:
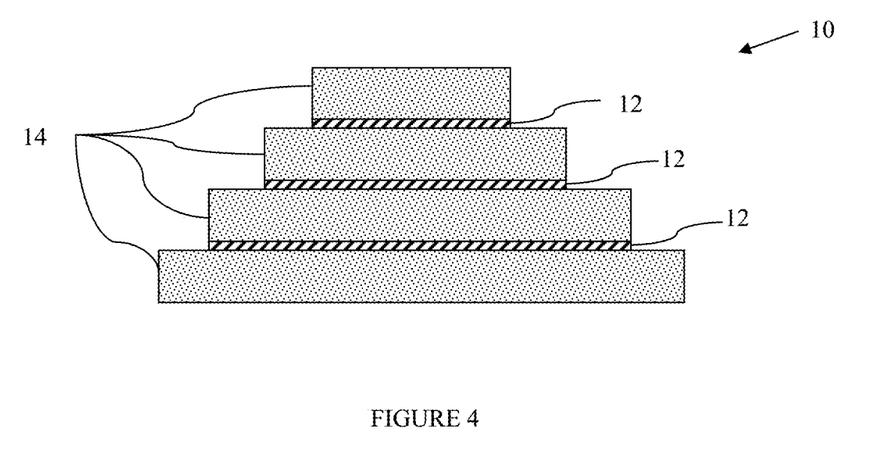
FIGS. 4-6 show cross-sectional views of various stepped-tier heat spreaders.
Figure 5:
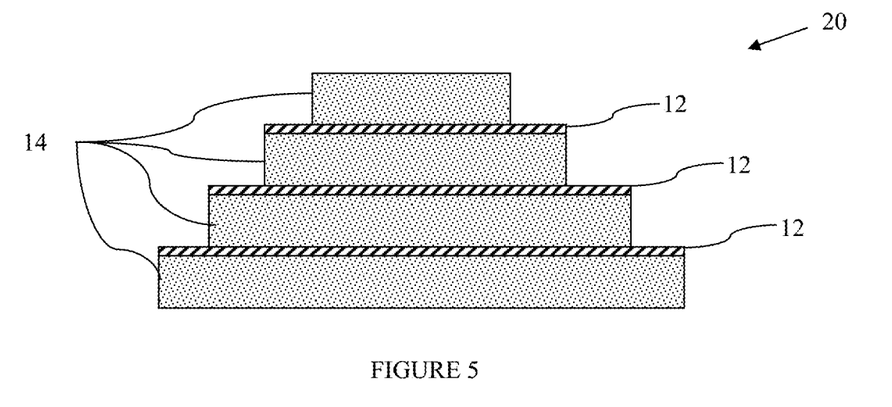
Figure 6:
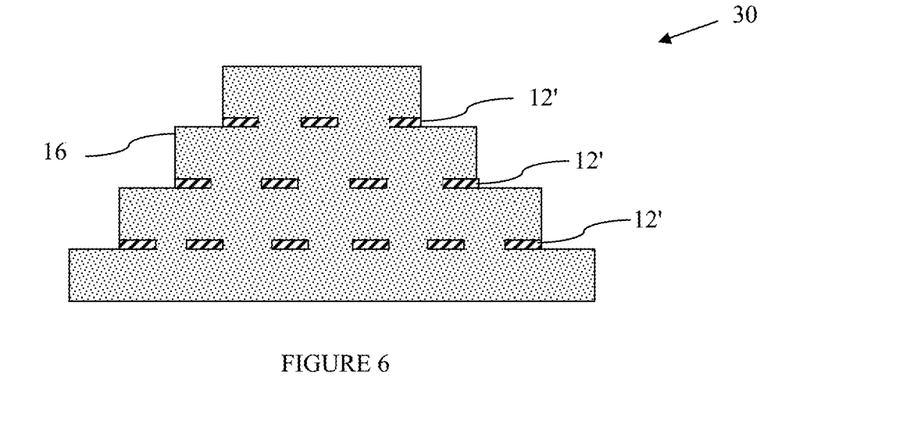

Illustrative tapered structures that can be utilized within heat spreaders of the present disclosure will now be described in further detail. In some embodiments, the tapered structure can be prismatic or resemble a truncated cone. FIGS. 1 and 2 show perspective views of illustrative prismatic and truncated cone heat spreaders 1 and 2, respectively. In such tapered structures, the tapering gradient is continuous. In other embodiments, the tapered structure of the heat spreaders can include a plurality of stepped tiers. FIG. 3 shows a perspective view of an illustrative stepped-tier heat spreader 3. In such tapered structures, the tapering gradient is non-continuous. Specifically, in the configuration of FIG. 3, the tapering gradient is a stepped gradient. FIGS. 4-6 show cross-sectional views of various stepped-tier heat spreaders of the present disclosure, which are described in further detail hereinafter.

Further description of the interlayer structure of the metal-diamond composites within the heat spreaders of the present disclosure will now be provided in reference to FIGS. 4-6. Although the description that follows is directed to heat spreaders having a stepped-tier configuration, it is to be recognized that similar interlayers can be incorporated in any type of tapered structure, such as those shown in FIGS. 1 and 2. More particularly, FIGS. 4 and 5 show cross-sectional views of heat spreaders 10 and 20, respectively, having a stepped-tier configuration in which a plurality of continuous interlayers 12 are present within a metal-diamond composite containing a continuous metallic phase. Heat spreaders 10 and 20 each contain 4 tiers of progressively increasing size. Continuous interlayers 12 are disposed between layers 14 of the metal-diamond composite that contain micron-scale diamond particles within the continuous metallic phase, as discussed above. The configurations of FIGS. 4 and 5 differ in the lateral sizes of continuous interlayers 12. In FIG. 4, continuous interlayers 12 are of the same lateral size as layer 14 disposed above it. In contrast, in FIG. 5, continuous interlayers 12 are of the same lateral size as layer 14 disposed below it. Both types of continuous interlayers 14 can function in lateral heat distribution, as discussed above.

As indicated above, interlayers need not necessarily be continuous in order to promote lateral distribution of heat. Correspondingly, the regions of the metal-diamond composite containing micron-scale diamond particles need not necessarily be spaced apart in all locations for sufficient lateral distribution of heat to occur. That is, by appropriate disposition of a discontinuous interlayer, effective lateral distribution of heat can still occur, even when micron-scale diamond particles are disposed continuously through-plane in a portion of the metal-diamond composite. Where a discontinuous interlayer exists, the micron-scale diamond particles are still spaced apart at those locations. In some embodiments, the discontinuous interlayers are positioned in the composites such that there is no through-plane linear pathway containing micron-scale diamond particles stretching from one face of the composite to the other. By disposing the interlayers such that no through-plane linear pathway exists, effective lateral distribution of heat can still occur at the locations where the interlayers are present. Other discontinuous interlayer configurations are also possible, such as that provided by a lose weave of carbon or diamond fibers.

Turning now to FIG. 6, heat spreader 30 contains discontinuous interlayers 12' extending throughout partially continuous metallic phase 16 containing micron-scale diamond particles. The number, size and positioning of the discontinuities within discontinuous interlayers 12' should be considered illustrative and non-limiting. As indicated above, these parameters can be adjusted to promote a desired degree of lateral heat transfer.

Although FIGS. 3-6 have depicted heat spreaders containing four stepped tiers, it is to be recognized that this number is illustrative and non-limiting. Any number of tiers can be present to promote lateral heat distribution and to provide a sufficient lateral surface area for mating a heat spreader to a heat sink. The number of stepped tiers and their thicknesses can further be chosen to provide a desired geometry for a heat spreader to be employed in a particular application. One having ordinary skill in the art can determine a sufficient number of stepped tiers and corresponding interlayers to accomplish the foregoing purposes. In more particular embodiments, heat spreaders of the present disclosure can contain between about 8 and about 10 stepped tiers and a corresponding number of interlayers, or between about 3 and about 7 stepped tiers and a corresponding number of interlayers, or between about 4 and about 6 stepped tiers and a corresponding number of interlayers.

In more particular embodiments, the interlayers of the present disclosure can range between about 20 microns and about 500 microns in thickness. Even such thin interlayers layers can be sufficient to discourage through-plane heat transfer when employing the disclosure herein. In other illustrative embodiments, the interlayers can range between about 20 microns and about 100 microns in thickness, or between about 50 microns and about 150 microns in thickness, or between about 100 microns and about 200 microns in thickness, or between about 250 microns and about 350 microns in thickness. Moreover, in some embodiments, heat spreaders of the present disclosure can contain a metal-diamond composite in which each of the interlayers have substantially the same thickness. In other embodiments, at least some of the interlayers can differ in thickness. Considerations directed to the number, thickness, and/or spacing of the interlayers can be determined by thermal modelling.

As indicated above, the interlayers within the metal-diamond composites of the present disclosure lack micron-scale diamond particles in order to discourage through-plane heat transfer. The interlayers need not necessarily be diamond-free, however. For example, in some embodiments, the interlayers can contain nanodiamond particles, a plurality of fibers, or any combination thereof disposed in the continuous metallic phase of the interlayers. Nanodiamond particles, for example, can promote through-plane heat transfer but to a lesser degree than can micron-scale diamond particles due to their tendency to promote scattering, thereby encouraging lateral heat transfer in the regions of the metal-diamond composite containing the micron-scale diamond particles. As used herein, the term "nanodiamond" will refer to diamond particles having a size of about 100 nm or less. Fibers, in contrast, can promote lateral heat transfer within the interlayer itself, thereby distributing incoming heat in a manner consistent with that described above. In addition, fibers can also promote scattering and decreased thermal conductivity in the through-plane direction. In more particular embodiments, the plurality of fibers can be oriented laterally (i.e., substantially in-plane) within the interlayers to accomplish such lateral heat distribution. Lateral disposition of the fibers can promote fiber-to-fiber heat transfer in-plane within the interlayers, thereby promoting lateral distribution of heat.

Fibers can be utilized in the interlayers of the present disclosure in any form. In some embodiments, the fibers can be in an interlayer in the form of a mat of chopped fibers. In other embodiments, woven fibers can be present in the interlayers. Woven and chopped fibers can be easily infused with metal nanoparticles, thereby allowing a continuous metallic phase to extend between the interlayers and the regions of the composite having the micron-scale diamond particles. Suitable fibers for inclusion in the interlayer can include, for example, metal fibers such as Al fibers, carbon fibers, ceramic fibers such as SiC fibers or BN fibers, and the like. Even carbon nanotubes can be present in the interlayers in some embodiments. Carbon nanotubes can be particularly useful for promoting lateral heat transfer through a ballistic mechanism when oriented in-plane within the interlayers.

High impedance values can be present perpendicular to the longitudinal axes of the carbon nanotubes.

In some embodiments, heat spreaders of the present disclosure can contain a metal-diamond composite in which each of the interlayers contain the same components. For example, in some embodiments, each of the interlayers can contain nanodiamond particles only, fibers only, or a mixture of nanodiamond particles and fibers in the continuous metallic phase. The relative amounts of the components in each interlayer can similarly differ or be the same. In other embodiments, at least some of the interlayers within the metal-diamond composite can differ in composition and/or the relative amounts of components present therein. Again, such considerations can be a matter of design and can be determined by one having ordinary skill in the art and the benefit of this disclosure.

In further embodiments, the continuous metallic phase within the metal-diamond composites can contain a carbide-forming additive. For purposes of this disclosure, diamonoid compounds will be considered to constitute carbides. Carbide-forming additives can promote formation of a transitional surface carbide upon the micron-scale diamond particles and nanodiamond particles, if present. The surface carbide can ensure good thermal contact with the continuous metallic phase. Suitable carbide-forming additives can include, for example, titanium, cobalt, nickel, iron or any combination thereof. Particularly suitable carbide-forming additives can include, for example, a mixture of titanium and nickel, and a mixture of iron, cobalt and nickel. A Pd dusting (e.g., 0.1 wt. %) on the micron-scale diamond particles can similarly promote more effective heat transfer.

In some embodiments, suitable carbide-forming additives can be introduced to the continuous metallic phase already coated on the micron-scale diamond particles and/or the nanodiamond particles. Coating can be accomplished using a solution of a metal salt, such as a metal chloride. Thereafter, the surface coating of the metal salt can be reduced (e.g., using hydrogen, hydrazine, metal hydrides, sodium borohydride, or the like). In some embodiments, surface coating with the metal salt and reduction can occur consecutively within the same reaction vessel.

In more particular embodiments, the continuous metallic phase can constitute copper. As discussed above, copper can be particularly desirable for inclusion within heat spreaders of the present disclosure due to this metal's high thermal conductivity and impedance matching to micron-scale diamond particles. Further, copper nanoparticles can be readily synthesized in a size range that allows low-temperature processing and is compatible for maintaining a nanoparticulate grain size in the metal-diamond composites disclosed herein. Illustrative disclosure on metal nanoparticles and their synthesis follows hereinbelow.

A number of scalable processes for producing bulk quantities of metal nanoparticles, such as copper nanoparticles, in a targeted size range have been developed, several of which are further described hereinbelow. Such processes typically involve reducing a metal precursor in the presence of a surfactant, followed by isolation of the metal nanoparticles from the reaction mixture. The metal nanoparticles can have a surfactant coating on their exterior surface, which can further tailor the properties of the metal nanoparticles. Such metal nanoparticles can be further dispersed in a solvent for improved workability and dispensation, or formulated into a paste. Exemplary compositions are described hereinbelow.

Particularly facile metal nanoparticle fabrication techniques are described in commonly owned U.S. Pat. Nos. 7,736,414, 8,105,414, 8,192,866, 8,486,305, 8,834,747, and 9,095,898; and commonly owned United States Patent Application Publication 2013/0209692, each of which is incorporated herein by reference in its entirety. As described therein, metal nanoparticles can be fabricated in a narrow size range by reduction of a metal salt in a solvent in the presence of a suitable surfactant system. Further description of suitable surfactant systems follows below. In the presence of a suitable surfactant system, metal nanoparticles having a size range between about 1 nm and about 50 nm and including a surfactant coating thereon can be produced. In more particular embodiments, metal nanoparticles having a surfactant coating and a size range between about 1 nm and about 20 nm, or between about 1 nm and about 10 nm, or between about 1 nm and about 7 nm, or between about 1 nm and about 5 nm can be produced.

Suitable organic solvents for solubilizing metal salts and forming metal nanoparticles can include aprotic solvents such as, for example, formamide, N,N-dimethylformamide, dimethyl sulfoxide, dimethylpropylene urea, hexamethylphosphoramide, tetrahydrofuran, glyme, diglyme, triglyme, tetraglyme, and the like. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or a tetraalkylammonium borohydride).

Figure 7:
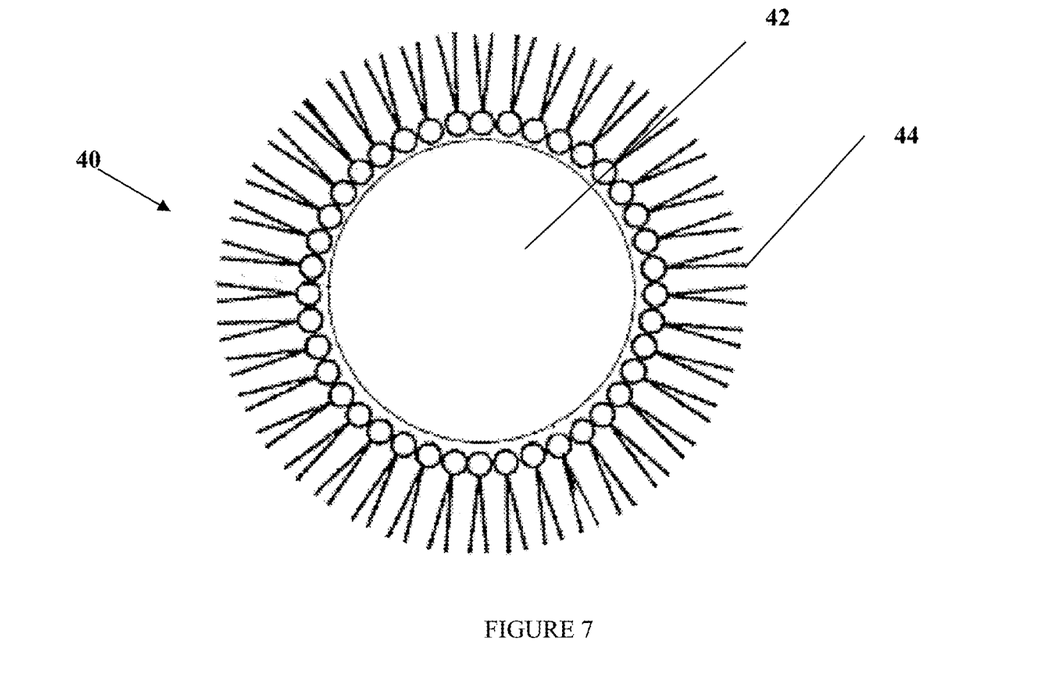
FIGS. 7 and 8 show presumed structures of illustrative metal nanoparticles having a surfactant coating thereon.
Figure 8:
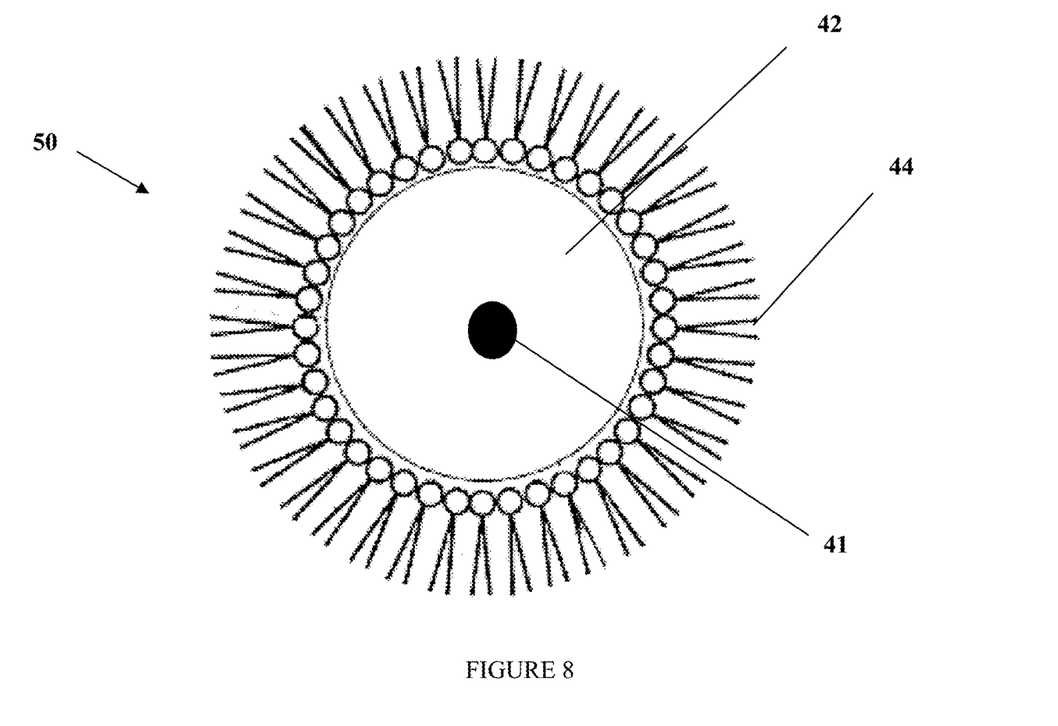

Without being bound by any theory or mechanism, FIGS. 7 and 8 show presumed structures of illustrative metal nanoparticles having a surfactant coating thereon. As shown in FIG. 7, metal nanoparticle 40 includes metallic core 42 and surfactant layer 44 overcoating metallic core 42. Surfactant layer 44 can contain any combination of surfactants, as described in more detail below. Metal nanoparticle 50 shown in FIG. 8 is similar to that depicted in FIG. 7, but metallic core 42 is grown about nucleus 41, which can be a metal that is the same as or different than that of metallic core 42. Because nucleus 41 is buried deep within metallic core 42 in metal nanoparticle 50, it is not believed to significantly affect the overall nanoparticle properties.

In various embodiments, the surfactant coating upon the metal nanoparticles contains one or more surfactants. The surfactant coating can be formed on the metal nanoparticles during their synthesis. Formation of a surfactant coating on the metal nanoparticles during their synthesis can desirably tailor the ability of the metal nanoparticles to fuse to one another, limit their agglomeration with one another, and promote the formation of a population of metal nanoparticles having a narrow size distribution.

In various embodiments, the surfactant system used to prepare the metal nanoparticles can include one or more surfactants. The differing properties of various surfactants can be used to tailor the properties of the metal nanoparticles, such as their size and reactivity. Factors that can be taken into account when selecting a surfactant or combination of surfactants for use in synthesizing metal nanoparticles can include, for example, ease of surfactant dissipation from the metal nanoparticles during nanoparticle fusion, nucleation and growth rates of the metal nanoparticles, affinity of the surfactants with the chosen metal, and the like.

In some embodiments, an amine surfactant or combination of amine surfactants, particularly aliphatic amines, can be used during the synthesis of metal nanoparticles. Amine surfactants, in particular, can have a high affinity for bonding to copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. This surfactant system can be particularly efficacious for forming copper nanoparticles having a narrow size range distribution. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure versus having ready volatility and/or ease of handling. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used in some embodiments. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but can be readily dissociable during metal nanoparticle fusion.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for use in forming metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with forming metal nanoparticles can be envisioned by one having ordinary skill in the art.

Suitable pyridines can include both pyridine and its derivatives. Illustrative pyridines that can be suitable for use in forming metal nanoparticles include, for example, pyridine, 2-methylpyridine, 2,6-dimethylpyridine, collidine, pyridazine, and the like. Chelating pyridines such as bipyridyl chelating agents can also be used. Other pyridines that can be used in conjunction with forming metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be used in forming metal nanoparticles include, for example, trimethylphosphine, triethylphosphine, tributylphophine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with forming metal nanoparticles can be envisioned by one having ordinary skill in the art.

Suitable thiols can have a formula of RSH, where R is an alkyl or aryl group having from about 4 to about 16 carbon atoms. Illustrative thiols that can be used for forming metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with forming metal nanoparticles can be envisioned by one having ordinary skill in the art.

For dispensation to form metal-diamond composites of the present disclosure, the metal nanoparticles can be dispersed in an organic matrix containing one or more organic solvents. In some embodiments, this composition can be in the form of a paste. Use of the term "paste" does not necessarily imply an adhesive function. In some embodiments, at least some of the one or more organic solvents can have a boiling point of about 100° C. or greater. In some embodiments, at least some of the one or more organic solvents can have a boiling point of about 200° C. or greater. In some embodiments, the one or more organic solvents can have boiling points ranging between about 50° C. and about 200° C. Use of high boiling organic solvents can desirably increase the pot life. In some embodiments, at least some of the one or more organic solvents can have a boiling point that is higher than those of the surfactants associated with the metal nanoparticles. Accordingly, in such embodiments, the surfactant(s) can be removed from the metal nanoparticles by evaporation before removal of the organic solvent(s) takes place.

In some embodiments, an organic matrix containing one or more hydrocarbons, one or more alcohols, one or more amines, and one or more organic acids can be especially desirable. Without being bound by any theory or mechanism, it is believed that this combination of organic solvents can facilitate the removal and sequestration of surfactant molecules surrounding the metal nanoparticles, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

In some embodiments, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In some embodiments, the organic matrix can contain one or more alcohols. In various embodiments, the alcohols can include monohydric alcohols, diols, triols, glycol ethers (e.g., diethylene glycol and triethylene glycol), alkanolamines (e.g., ethanolamine, triethanolamine, and the like), or any combination thereof. In some embodiments, one or more hydrocarbons can be present in combination with one or more alcohols. As discussed above, it is believed that alcohol and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present in the nanoparticle compositions include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy)ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present in the organic matrix include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the organic matrix include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

Having now described the heat spreaders of the present disclosure and the metal nanoparticles used in their manufacture, more particular disclosure regarding fabrication of the heat spreaders from metal nanoparticles and incorpora- tion of the heat spreaders within systems containing a heat source and heat sink will now be provided.

In some embodiments, systems of the present disclosure can include: a heat source, a heat sink, and a heat spreader of the present disclosure extending between the heat source and the heat sink and bonded thereto. More particularly, the heat spreader can include a tapered structure including a metal-diamond composite, where the metal-diamond composite includes a continuous metallic phase and a plurality of micron-scale diamond particles located in spaced apart regions of the continuous metallic phase. An interlayer including the continuous metallic phase but lacking micron-scale diamond particles is disposed between each of the spaced apart regions. The metal-diamond composite increases in lateral size from the heat source to the heat sink, as shown hereinafter in reference to FIG. 9. As discussed above, heat spreader can exhibit greater thermal conductivity in a lateral direction than in a through-plane direction, thereby allowing lateral distribution of heat from the heat source to the heat sink to be realized. Advantageously, the heat spreaders of the present disclosure can promote lateral distribution of heat without utilizing moving parts or forced circulation of the heat in a desired direction.

Figure 9:
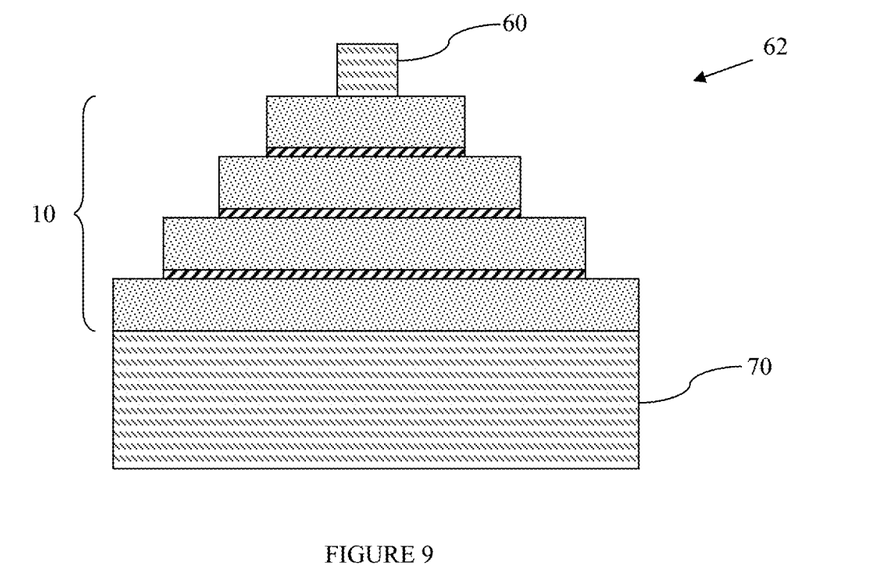
FIG. 9 shows an illustrative schematic of a system containing a heat spreader of the present disclosure extending between a heat source and heat sink.

FIG. 9 shows an illustrative schematic of a system containing a heat spreader of the present disclosure extending between a heat source and heat sink. Specifically, FIG. 9 shows that heat spreader 10 (see FIG. 4) is bonded between heat source 60 and heat sink 70 in system 62, where heat source 60 has a relative small dimensional area compared to heat sink 70. Heat spreader 10 allows the heat to spread laterally upon reaching heat sink 70, thereby allowing the heat to dissipate more effectively from system 62. Although FIG. 9 has shown specific heat spreader 10 of FIG. 4, it is to be recognized that any other heat spreader of the present disclosure can also be utilized similarly.

The mode of bonding of the heat spreader to the heat source and the heat sink is not considered to be particularly limited. In general, any bonding mode allowing a robust thermal connection to be established can be employed. In illustrative embodiments, the heat spreader can be soldered or welded to the heat source and the heat sink. In other illustrative embodiments, mechanical attachment (e.g., with screws, clips, or the like) can be used. In the case of mechanical attachment, highly polished surfaces to assure good thermal contact may be needed. In still other instances, thermal greases, thermal epoxies and thermal gaskets can be used for connecting the heat spreader to the heat source and the heat sink.

Likewise, the identities of the heat source and the heat sink are not considered to be particularly limited. In illustrative embodiments, the heat source can be an electronic component such as a power amplifier, a high-power and high-frequency electronic component such as a monolithic microwave integrated circuit, a light-emitting diode, a solar panel, modulators, analog to digital converters (A/D converters), application-specific integrated circuits (ASICs), mixers, field programmable gate arrays (FPGAs), receivers, transmitters, tuners, microwave power modules (MPMs), integrated power conditioners (IPC), power supplies, power converters, laser diodes, X-ray anodes, or the like. Suitable heat sinks can include, but are not limited to, radiator structures, heat pipes, active liquid or air cooling systems, chiller systems, and cryocooling systems. Employing a heat spreader of the present disclosure in conjunction with a heat pipe can allow dry areas within the heat pipe to be avoided or substantially minimized, thereby allowing more efficient thermal management to be realized.

Methods for fabricating the heat spreaders of the present disclosure can include: disposing a first mixture containing micron-scale diamond particles and metal nanoparticles in first regions that are vertically spaced apart from each other, disposing a second mixture containing metal nanoparticles but lacking micron-scale diamond particles in second regions located between each of the first regions, and at least partially fusing the metal nanoparticles to form a tapered structure containing a metal-diamond composite. The first regions increase progressively in lateral size, and the metal-diamond composite includes a continuous metallic phase within the first regions and the second regions.

In some embodiments, disposing the first and second mixtures can include, for example, screen printing, stencil printing, inkjet printing, syringe deposition, aperture deposition, spraying, spreading, painting, or the like of the first and second mixtures. In general, any deposition technique can be used that allows the first mixture and the second mixture to be placed in a desired location can be used. The chosen deposition technique for the first mixture and the second mixture can be the same or different. For example, more precise deposition techniques can be desirable for the interlayers of the present disclosure in order to maintain the interlayers in a particular location or with a desired thickness. Any of the nanoparticle compositions described hereinabove, including nanoparticle pastes, can be utilized in disposing the first and second mixtures.

In some embodiments, consolidation of the metal nanoparticles to form the metal-diamond composite can take place through a hot pressing process. Suitable processing temperatures and equipment for hot pressing processes will be familiar to one having ordinary skill in the art, particularly given the benefit of the present disclosure in regard to consolidation of metal nanoparticles. Generally, such hot pressing processes can involve heating the deposited metal nanoparticles in a mold while applying a compressive force thereto. More particularly, such consolidation processes can include disposing the first mixture and the second mixture by sequentially casting the first mixture and the second mixture into a mold in layers, and at least partially fusing the metal nanoparticles through hot pressing the layers in the mold. In illustrative embodiments, the consolidation pressure can be up to about 2000 psi and range between about 200° C. and about 450° C. The deposited layers, particularly the layers that become the interlayers upon consolidation, can be continuous or discontinuous as discussed above. In more particular embodiments, the mold can have a tapered shape, thereby allowing the tapered structures of the present disclosure to be obtained directly following consolidation.

In further embodiments, methods of the present disclosure can include bonding the tapered structure to a heat source and a heat sink. More particularly, a smaller face of the tapered structure constituting the heat spreader can be bonded to the heat source, and a larger face of the tapered structure constituting the heat spreader can be bonded to the heat sink. Suitable techniques for bonding the heat spreader to the heat source and the heat sink are discussed above.

Although the disclosure has been described with reference to the above embodiments, one of ordinary skill in the art will readily appreciate that these are only illustrative of the disclosure. It should be understood that various modifications can be made without departing from the spirit of the disclosure. The disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description.

What is claimed is the following:

1. A heat spreader comprising:
a tapered structure comprising a metal-diamond composite;
wherein the metal-diamond composite comprises a continuous metallic phase and a plurality of micron-scale diamond particles dispersed through the continuous metallic phase in spaced apart regions of the continuous metallic phase;
wherein an interlayer comprising the continuous metallic phase but lacking micron-scale diamond particles is disposed between each of the spaced apart regions;
wherein the metal-diamond composite increases in lateral size in a direction of increased tapering;
wherein a first outer surface of the tapered structure is spaced apart from and is located opposite to a second outer surface of the tapered structure; and
wherein the first outer surface of the tapered structure is smaller than the second outer surface of the tapered structure.

2. The heat spreader of claim 1, wherein the plurality of micron-scale diamond particles range between about 200 microns and about 250 microns in size.

3. The heat spreader of claim 1, wherein the metal-diamond composite comprises about 40% to about 70% micron-scale diamond particles by volume.

4. The heat spreader of claim 1, wherein the tapered structure comprises a plurality of stepped tiers.

5. The heat spreader of claim 1, wherein the continuous metallic phase has a grain size of about 250 nm or less.

6. The heat spreader of claim 1, wherein the continuous metallic phase comprises copper.

7. The heat spreader of claim 1, wherein the continuous metallic phase further comprises a carbide-forming additive.

8. The heat spreader of claim 1, wherein the interlayers further comprise nanodiamond particles, a plurality of fibers, or any combination thereof disposed in the continuous metallic phase.

9. The heat spreader of claim 8, wherein the plurality of fibers are oriented laterally in the interlayers.

10. The heat spreader of claim 8, wherein the interlayers range between about 20 microns and about 500 microns in thickness.

11. A system comprising:
a heat source;
a heat sink; and
a heat spreader extending between the heat source and the heat sink and bonded thereto;
wherein the heat spreader comprises:
a tapered structure comprising a metal-diamond composite;
wherein the metal-diamond composite comprises a continuous metallic phase and a plurality of micron-scale diamond particles dispersed through the continuous metallic phase in spaced apart regions of the continuous metallic phase;
wherein an interlayer comprising the continuous metallic phase but lacking micron-scale diamond particles is disposed between each of the spaced apart regions; and
wherein the metal-diamond composite increases in lateral size from the heat source to the heat sink.

12. The system of claim 11, wherein the plurality of micron-scale diamond particles range between about 200 microns and about 250 microns in size.

13. The system of claim 11, wherein the metal-diamond composite comprises about 40% to about 70% micron-scale diamond particles by volume.

14. The system of claim 11, wherein the tapered structure comprises a plurality of stepped tiers.

15. The system of claim 11, wherein the continuous metallic phase comprises copper.

16. The system of claim 11, wherein the interlayers further comprise nanodiamond particles, a plurality of fibers, or any combination thereof disposed in the continuous metallic phase.

17. The system of claim 16, wherein the interlayers range between about 20 microns and about 500 microns in thickness.

* * * * *